United States Patent [19]

Sugai

[11] Patent Number: 5,030,930
[45] Date of Patent: Jul. 9, 1991

[54] SURFACE-ACOUSTIC-WAVE CONVOLVER

[75] Inventor: Kazuyoshi Sugai, Tokyo, Japan

[73] Assignee: Clarion Co., Ltd., Tokyo, Japan

[21] Appl. No.: 376,758

[22] Filed: Jul. 7, 1989

[30] Foreign Application Priority Data

Jul. 15, 1988 [JP] Japan .................................. 63-176429

[51] Int. Cl.$^5$ .............................................. H03H 9/42
[52] U.S. Cl. .................................... 333/150; 333/154;
310/313 R; 310/313 D; 364/821; 364/824
[58] Field of Search ................................ 333/150–154,
333/193–196; 310/313 R, 313 A, 313 B, 313 C,
313 D; 364/821, 824

[56] References Cited

U.S. PATENT DOCUMENTS 3,979,700  9/1976  Grace ................................... 333/150
4,016,514  4/1977  Reeder et al. ....................... 333/150
4,037,174  7/1977  Moore et al. ........................ 333/193
4,100,498  7/1978  Alsup et al. ..................... 333/150 X

OTHER PUBLICATIONS

Morgan, David P. et al., "Efficiency of the SAW Diode Convolver"; *IEEE Trans on Electron Devices;* vol. ED 23, No. 6, Jun. 1976, pp. 573–579.

*Primary Examiner*—Benny T. Lee
*Attorney, Agent, or Firm*—Wallenstein, Wagner & Hattis, Ltd.

[57]  ABSTRACT

A strip coupled type convolver includes an aluminum nitride (AlN) layer and a semiconductor layer both provided on a single sapphire substrate, and includes many metal strips extending across a surface wave propagating path on a surface of the AlN piezoelectric layer to transmit a potential on the piezoelectric surface to a Schottky diode array provided on the semiconductor surface to cause a nonlinear interaction.

14 Claims, 8 Drawing Sheets

SURFACE-ACOUSTIC-WAVE CONVOLVER

FIELD OF THE INVENTION

This invention relates to a surface-acoustic-wave (hereinafter called "SAW") convolver used in a spread-spectrum communication system.

BACKGROUND OF THE INVENTION

A monolithic convolver formed by providing a ZnO layer directly on a semiconductor Si surface is characterized by a relatively great in the TB product (T:signal processing time, B: bandwidth), has a high efficiency and is obtained at a low cost. These features lead to the possibility of using such convolver as a key device in a correlation signal processing apparatus of a spread-spectrum communication system.

However, such a monolithic convolver still involves the following drawbacks:

(i) A bias voltage must be applied to a metal gate on the ZnO layer in order to hold the Si surface in a depletion condition.

(ii) It takes a very long time constant to establish a constant condition of the Si surface after the bias voltage is applied, to the metal gate on the ZnO layer. A major reason for this is incompleteness of the ZnO layer.

(iii) The manufacturing yield is decreased by the process of providing the ZnO layer generally by sputtering, because the underlying Si substrate is known to be damaged by the plasma in the sputtering process.

(iv) The propagation loss of surface waves is large when they propagate along the ZnO layer surface on the Si substrate, and this invites a relatively large decrease in the efficiency.

(v) The Sezawa mode, although most often used because of its significantly large coupling coefficient, exhibits a relatively large speed dispersion of surface acoustic,, waves, and this nature necessarily limits the band width of the element.

OBJECT OF THE INVENTION

It is therefore an object of the invention to provide a surface-acoustic-wave convolver removing in particular the drawback caused by incompleteness of the ZnO layer, while maintaining the advantages of a monolithic convolver such as monolithic structure and high efficiency.

SUMMARY OF THE INVENTION

In order to attain the object, there is provided a surface-acoustic-wave convolver comprising a sapphire substrate; a piezoelectric layer provided in a first portion on a major surface of said sapphire substrate; two input transducers provided on said piezoelectric layer; an array of metal strips provided between said two input transducers; and an array of diodes consisting of a semiconductor provided in a second portion on said major surface of said sapphire substrate, and an array of electrodes connected between said metal strips and an output electrode.

Because of the strip-coupled-type convolver using AlN, a stable convolver having a high efficiency monolithic structure, and not requiring a bias voltage is obtained.

DETAILED DESCRIPTION OF THE INVENTION

The invention is described below in greater detail, referring to a preferred embodiment illustrated in the drawings. The illustration is only an example, and the invention may involve various modifications and improvements without departing from the scope thereof.

Figure 1:
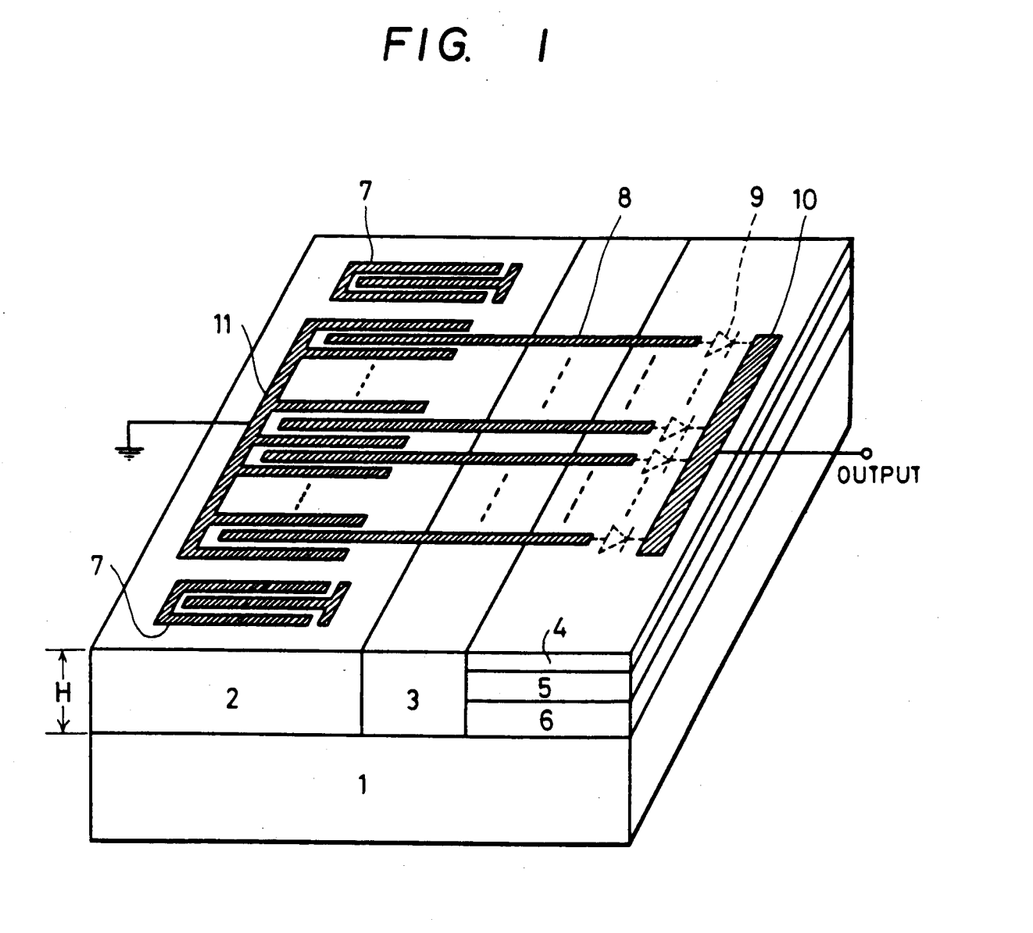
FIG. 1 is a perspective view of SAW convolver embodying the invention.

FIG. 1 is a perspective view of a SAW convolver taken as an embodiment of the invention. In the drawing, reference numeral 1 refers to sapphire single-crystal substrate, and 2, 3 and 6 are respectively an aluminum nitride (AlN) epitaxial layer, a dielectric layer and an n+-type silicon layer with highly-concentrated doped n-type impurities, all provided on the sapphire single-crystal substrate 1.

A surface of the aluminum nitride layer 2 is used as a SAW propagation path. The n+-type Si layer 6 is provided for reducing the series resistance component of a Schottky diode formed thereon.

The dielectric layer 3 is in the form of a silicon oxide layer, nitride layer or high polymer layer which connects an island region in the form of the aluminum nitride layer 2 to an island region in the form of a silicon layer. The region between both island regions is shaped planar enough to prevent a metal strip connecting the islands from being cut off. Reference numeral 5 denotes an n-type epitaxial layer provided on the n+-type Si layer 6, and 4 denotes a silicon oxide layer provided on the n-type Si layer 5.

Reference numeral 7 refers to input transducers of the convolver provided on the AlN layer 2, and 8 refers to an array of metal strips connecting the AlN layer 2 to an array of Schottky diodes 9 formed in the Si layers 4, 5 and 6 to transmit the potential of a SAW traveling on the AlN layer 2 to the array of the Schottky diodes. Reference numeral 10 refers to a convolver output terminal connected to the array of Schottky diodes 9. Reference numeral 11 denotes a comb-shaped grounded electrode formed on the AlN layer 2. Among respective fingers of the electrode 11 the metal strip electrodes are placed, and they form an interdigitating region which is a SAW propagation path.

Figure 2:
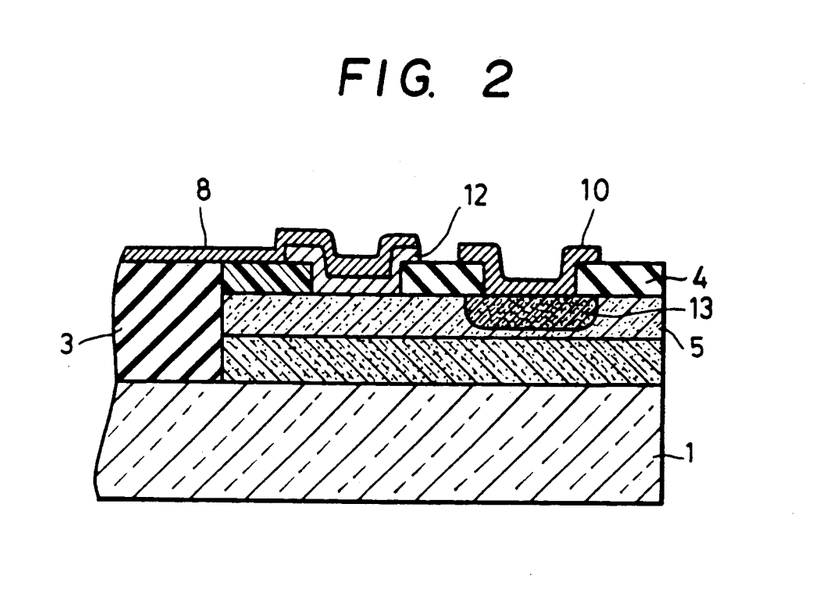
FIG. 2 is a detailed cross-sectional view of a Schottky diode formed in a Si layer.

FIG. 2 is a detailed cross-sectional view of a Schottky diode provided in the Si layer.

Reference numeral 12 denotes a Schottky electrode provided for forming a Schottky contact with the n-type Si epitaxial layer 5. That is, the Schottky electrode 12 contacts the n-type Si epitaxial layer 5 through a contact hole provided in the oxide layer 4. The metal strip array 8 is provided on and in contact with the Schottky electrode 12. The Schottky electrode 12, however, may be omitted when the metal of the metal strip array 8 is identical to the metal of the Schottky electrode.

Reference numeral 13 denotes an n+-type diffused layer provided for establishing an ohmic contact between the convolver output electrode 10 and the n-type silicon epitaxial layer 5. Since the convolver output is an RF signal, the output electrode 10 and the n-type silicon layer 5 need not be in ohmic contact but may be in Schottky contact. Theefore, the n+-type diffused layer 13 is also omitted in some cases.

The aforedescribed embodiment operates as explained below.

SAW's inputted from the input transducer 7 propagate in opposed directions, and potentials of the SAW's are transmitted to the Schottky diode by the metal strip array 8. The Schottky diode behaves as a varactor diode, and a convolution signal appears at the output electrode 10 due to the nonlinearity of the depletion layer capacitance.

The input transducer has an electrode period (corresponding to the wavelength of SAW) of $\lambda_0 = 16$ $\mu$m and is a regular type whose number of pairs N is 8. The surface orientation of sapphire is an R surface (01$\bar{1}$2), and the SAW propagating direction is an equivalent direction to the [0$\bar{1}$11] axis of sapphire or an equivalent direction to the [0001] axis of AlN.

The thickness of the AlN layer is 2.6 $\mu$m. The acoustic velocity in this case is as fast as 6000 m/s. In order to increase the coupling coefficient, a value kH > 0.5 (k: number of waves of SAW, H: thickness of AlN layer) is required for the thickness of the AlN layer. When kH > 1.0, the coupling coefficient is about 1%, and no change is produced by further increasing the thickness of the AlN layer. Since the propagation loss is smaller when the AlN layer is thin, 0.5 < kH < 2.0 is preferable for the thickness of the AlN layer in view of the whole situation, and the present embodiment employs kH ≈ 1.0. Further, this region exhibits a small velocity dispersion and is suitable for use over a wider band.

Figure 3:
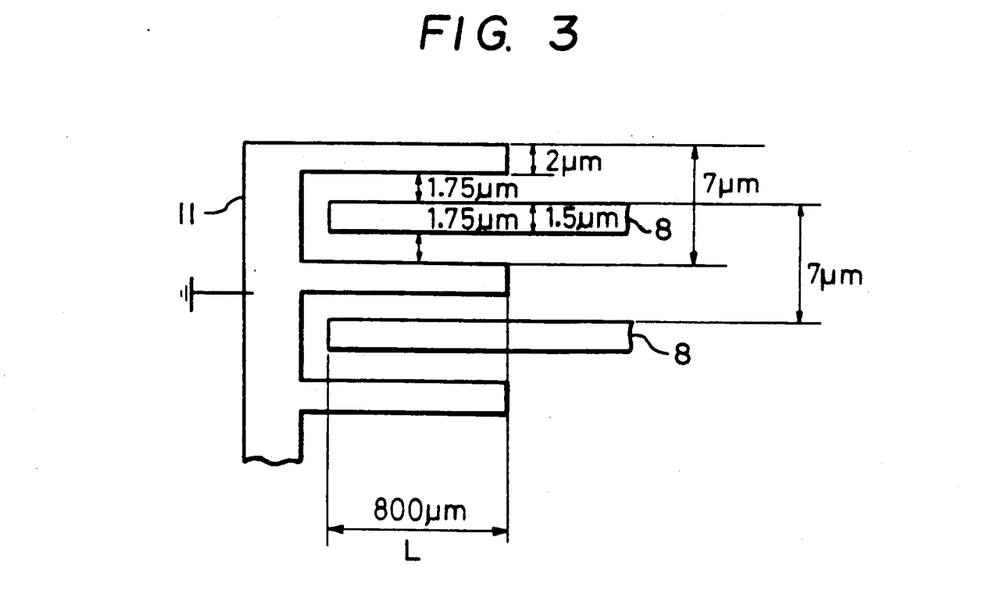
FIG. 3 is a fragmentary plan view of a metal strip array.

A preferable arrangement of the metal strip array portion is shown in FIG. 3 where the interdigitating width (overlap width L) of the comb-shaped grounded electrode 11 and the metal strip array 8 is 800 $\mu$m (50 $\lambda_0$) as is the interdigitating width of the input transducer 7. The electrode width Ws (see also FIG. 6) of the metal strip array 8 is about 1.5 $\mu$m, the width of the grounded electrode 11 is about 2.0 $\mu$m, and the ground electrode period $\mu_0$ is 7 $\mu$m. The electrode material is Al, and the number of the metal strips is 6300 pieces.

The thickness of the n-type Si epitaxial layer (FIG. 2) is about 2 $\mu$m, the impurity density is $3.0 \times 10^{14}$cm$^{-3}$, and the dopant is P (phosphorus). The Schottky electrode is made from titanium. In this arrangement, the width of the depletion layer is about 1.45 $\mu$m at room temperature, and the thickness of the epitaxial layer is 0.5 $\mu$m larger than the depletion layer width approximately.

The Schottky diode (Schottky contact) is (FIGS. 1 and 2) is 2 $\mu$m wide and 13 $\mu$m long. The output electrode is made from Al which is 200 $\mu$m wide and 44.15 $\mu$m long, and the n+-type diffused layer is provided to form an ohmic contact.

As is evident from FIG. 1, the dielectric layer 3 is chosen of enough thickness to provide a continuous coplanar structure from the aluminum nitride layer 2 to the region containing the layers 4, 5, 6. This layer 3 may be made of polyimide.

Under the above-explained arrangement, a highly efficient convolver having the TB product 365 (bandwidth BW = 48 MHz × processing time (delay time) 7.6 $\mu$sec) and having the convolver efficiency FT ≈ −36.5 dBm is established.

In this design of the convolver, there are some important points:

(i) impurity density of n-type Si epitaxial layer

Figure 4:
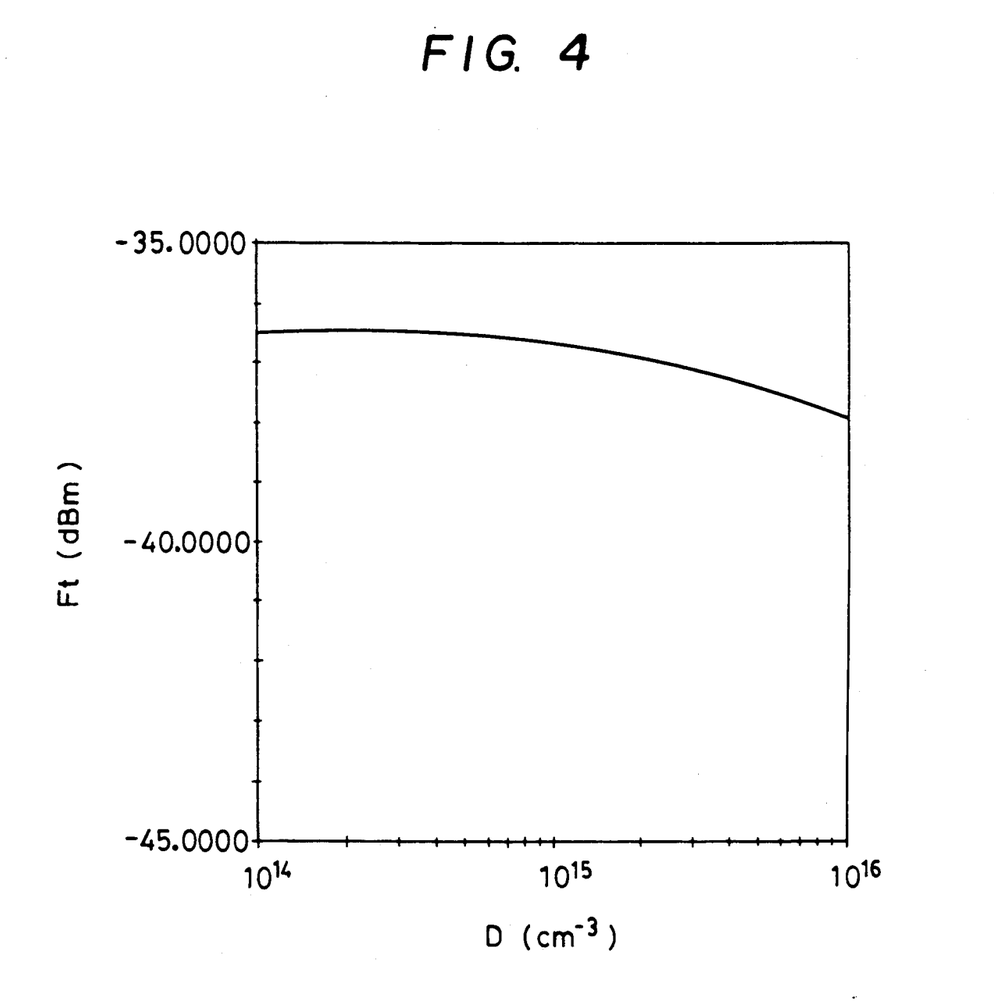
FIG. 4 is a graph showing changes in the convolver efficiency with the impurity concentration of an n-type Si epitaxial layer.

FIG. 4 shows a result of variation of the convolver efficiency FT by changing the impurity density of the n-type Si epitaxial layer from $1.0 \times 10^{14}$cm$^{-3}$ to $1.0 \times 10^{16}$cm$^{-3}$. When he donor density D is from $2.0 \times 10^{14}$cm$^{-3}$ to $3.0 \times 10^{14}$cm$^{-3}$ the maximum efficiency is obtained. It is evident that a value up to $5.0 \times 10^{15}$cm$^{-3}$ is also acceptable as the donor density.

(ii) length of strip electrode

The overlap length of the strip electrode means the length of a portion where it interdigitates (overlaps) with the comb-shaped grounded electrode, and it is the same as the interdigitating width of the input transducer.

Figure 5:
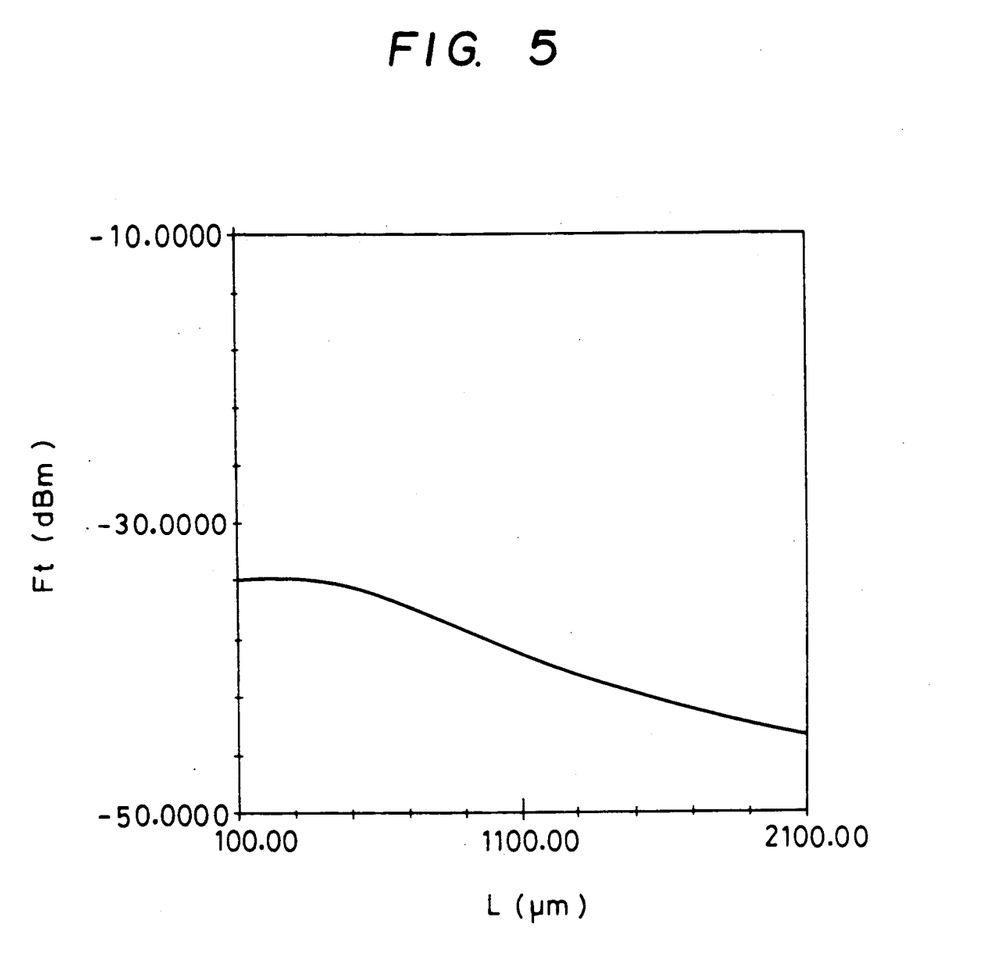
FIG. 5 is a graph showing changes in the convolver efficiency with the length of a strip electrode.

FIG. 5 shows a variation of the convolver efficiency FT by changing the overlap length L of the strip electrode from 100 $\mu$m to 2100 $\mu$m. As the strip electrode is shortened, the power density of SAW increases, and the convolver efficiency is increased. However, in accordance with this, the dynamic range is decreased provided the thickness of the epitaxial layer is held relatively small. The practically preferable value of the length L is about 800 $\mu$m. The overlap length of the strip (interdigitating width of the transducer) may be about 70$\lambda_0$ or less.

(iii) width of strip combinations of electrode

Figure 6:
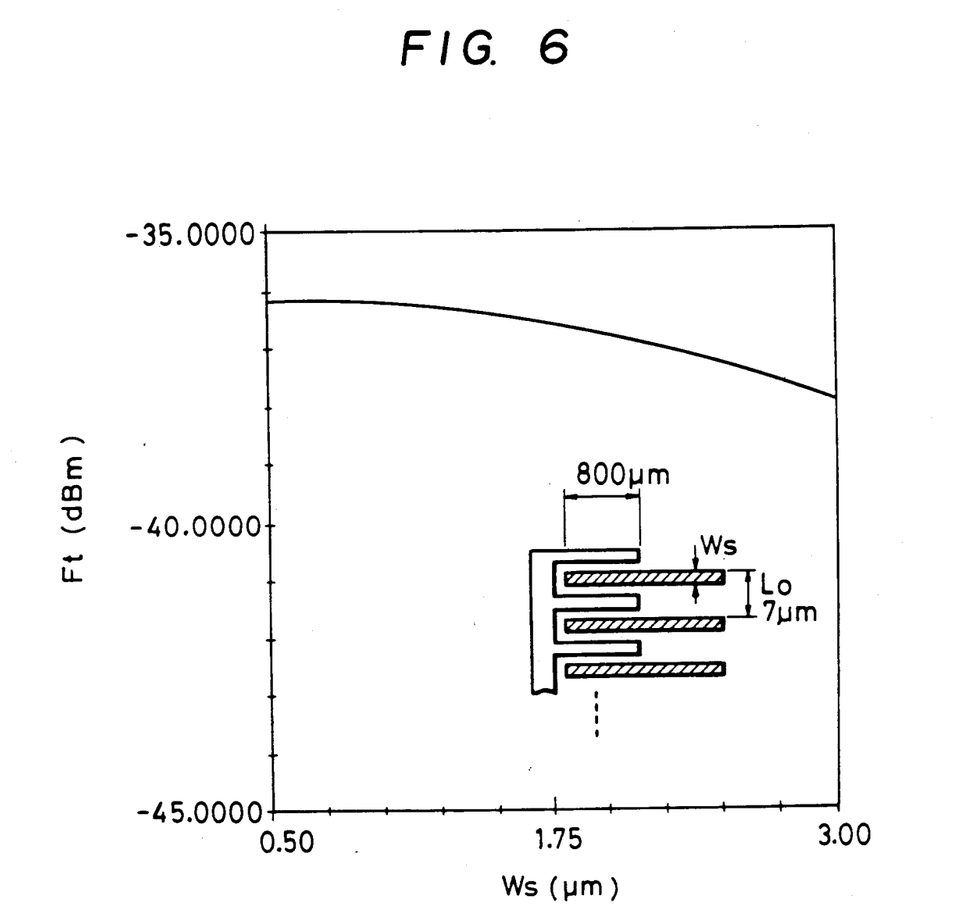
FIG. 6 is a graph showing changes in the convolver efficiency with the width of the strip electrode.

FIG. 6 shows the convolver efficiency FT as a result of changing the width Ws of the strip electrode from 0.5 $\mu$m to 3.0 $\mu$m. Indicating the period of the strip array by $L_o$ and the electrode width by $W_s$, $W_s/L_o$ of the strip array is preferably 0.07 to 0.40.

Figure 7:
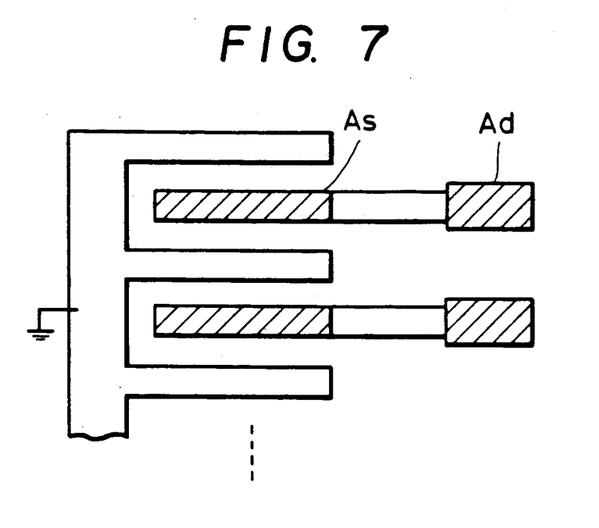
FIG. 7 is a fragmentary plan view of the metal strip array.
Figure 8:
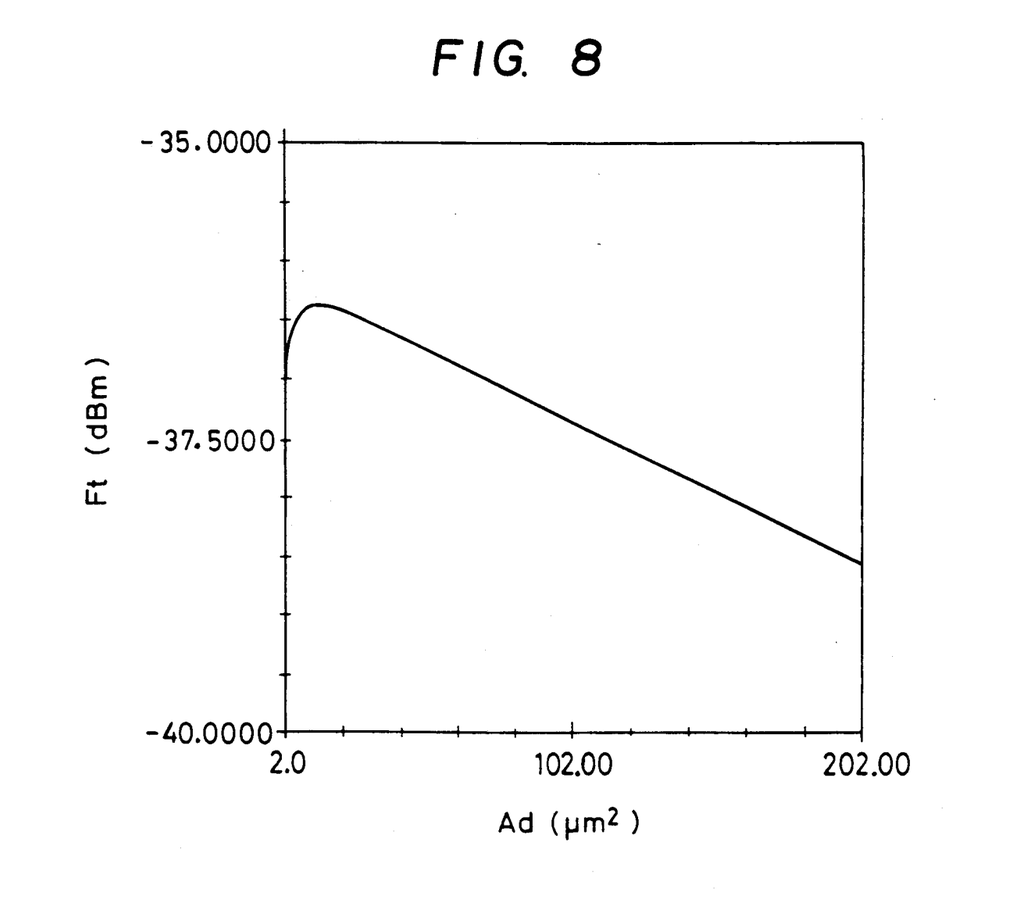
FIG. 8 is a graph showing changes in the convolver efficiency with the area of the Schottky diode.

$A_s$ indicates the area of the metal strip array where it interdigitates with the comb-shaped grounded electrode, and $A_d$ indicates the area of the Schottky diode (FIG. 7). FIG. 8 shows a result of evaluation of the convolver efficiency FT by changing the area of the Schottky diode from 2.0 $\mu$m$^2$ to 202 $\mu$m$^2$. $A_s$ in FIG. 8 is 1200 $\mu$m$^2$. The area $A_d$ of the Schottky diode is preferably $0.0015 < A_d < 0.085$.

(iv) thickness of n-type silicon epitaxial layer

Figure 9:
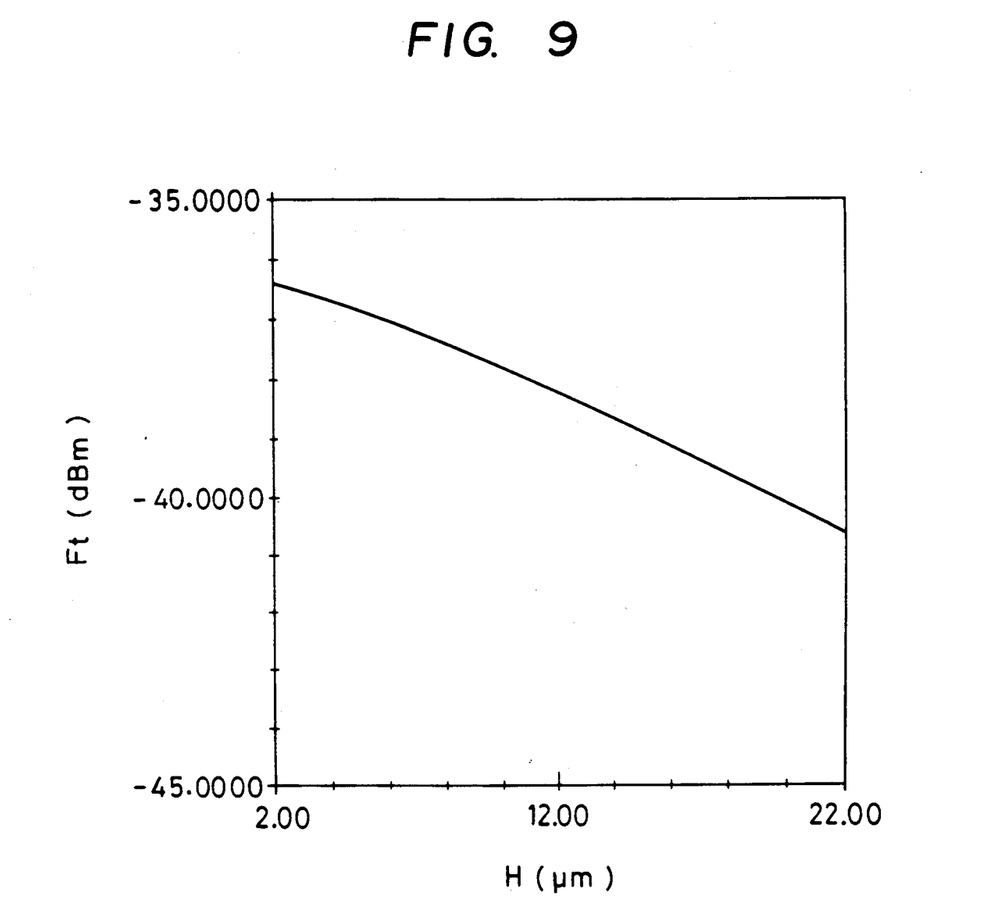
FIG. 9 is a graph showing changes in the convolver efficiency with the thickness of the n-type Si epitaxial layer.

FIG. 9 shows a result of evaluation of the convolver efficiency FT by changing the thickness H of the n-type silicon epitaxial layer from 2.0 $\mu$m to 22.0 $\mu$m. The thickness of the depletion layer under zero bias is about 1.5 $\mu$m, and it reads on the situation that the neutral region of n-type silicon of 0.5 $\mu$m to 20.5 $\mu$m remains. Since the convolver efficiency is decreased with an increase in the thickness of the neutral region, the thickness of the epitaxial layer must be as thin as 20 μm.

(v) electrode material for Schottky contact

Figure 10:
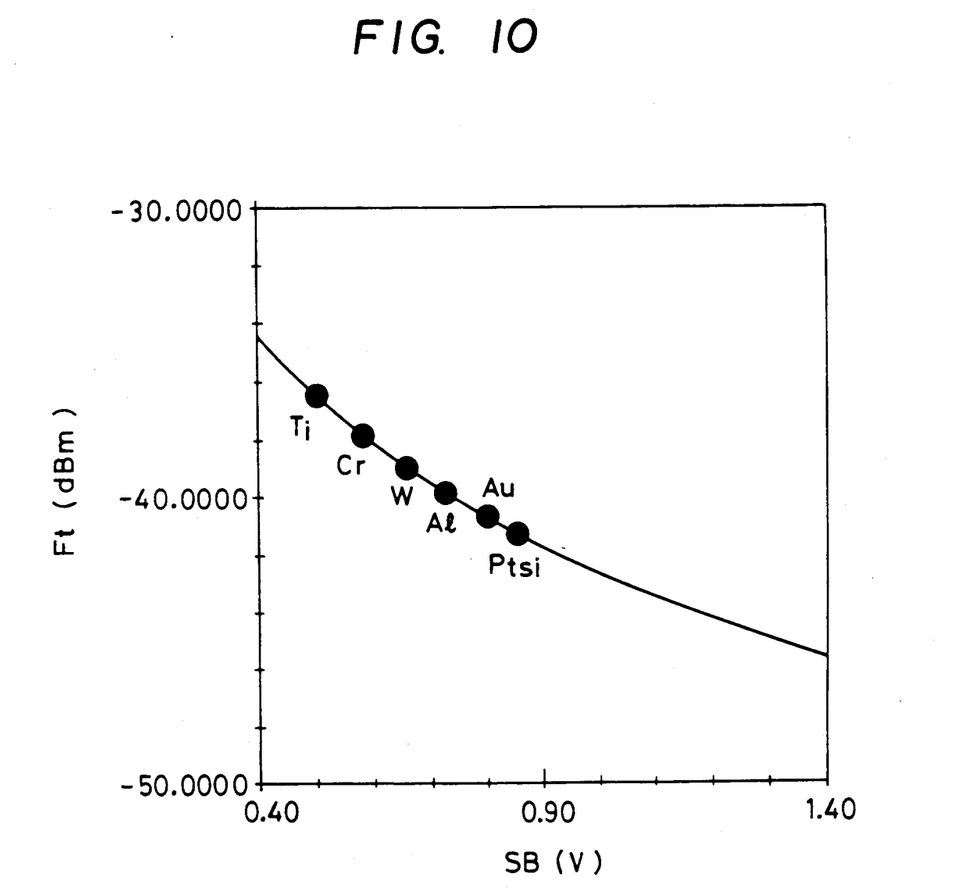
FIG. 10 is a graph showing changes in the convolver efficiency with the kind of metal material.

FIG. 10 shows the convolver efficiency FT obtained when the Schottky contact is made by electrode materials such Ti, Cr, W, Al, Au, PtSi, etc. The lower the Schottky barrier height SB(V), the higher, the convolver efficiency FT. A preferable electrode material for the Schottky contact is a metal having a barrier height of 1 eV or less with respect to the n-type silicon.

As described above, the invention has the following advantages:

(i) No d.c. bias voltage is required.
(ii) The reliability of the device is improved.
(iii) Since the velocity dispersion is small, a wider band convolver is obtained.
(iv) Since the AlN layer is deposited by CVD process, the productivity is improved significantly.
(v) Considering that the AlN layer is an epitaxial layer having a small propagation loss and that the wafer diameter will be large-scaled in the future, it is possible to further increase the processing time T in the TB product.

What is claimed is:

1. A surface acoustic wave convolver comprising:
a sapphire substrate having a major surface;
a piezoelectric layer provided on a first portion of said major surface;
two input transducers provided on said piezoelectric layer;
an array of metal strips each having a pair of elongated sides provided on said piezoelectric layer between said two input transducers;
a semi-conductor region provided on a second portion of said major surface set apart from said first portion;
an output electrode electrically connected to said semi-conductor region;
diode means associated with said semi-conductor region, and electrically connecting each of said metal strips to said semiconductor region; and
a dielectric layer provided on a third portion of said major surface between said piezoelectric layer and said semi-conductor region.

2. The surface acoustic wave convolver according to claim 1 wherein said piezoelectric layer is made from aluminum nitride, and said semi-conductor region includes a first semi-conductor layer having a high impurity density of given conductivity type disposed upon said substrate and a second layer of epitaxial semi-conductor having said given conductivity type deposited upon said first semi-conductor layer.

3. The surface acoustic wave convolver according to claim 1 wherein said metal strips are disposed as parallel elements each of the same given width and having a ujniform periodic inter-strip spacing and satisfying the relationship:

$$0.07 < W_S/L_O < 0.4$$

where $L_O$ indicates the period of said strip array, and $W_S$ indicates said strip width.

4. The surface acoustic wave convolver according to claim 1 further including a grounded electrode provided on said piezoelectric layer and connected to ground, said grounded electrode being in the form of comb teeth disposed along opposite sides of each of said metal strips.

5. The surface acoustic wave convolver according to claim 1 wherein said piezoelectric layer is made from aluminum nitride, and said semi-conductor region includes a first semi-conductor layer having a high impurity density of given conductivity type disposed upon said substrate and a second layer of epitaxial semi-conductor having said given conductivity type deposited upon said first semi-conductor layer, said epitaxial layer including an ohmic first conduction type high impurity density diffused layer along a surface portion hereof confronting and connected to said output electrode.

6. The surface acoustic wave convolver according to claim 5 wherein the thickness of said epitaxial layer is no more than about 20 microns.

7. The surface acoustic wave convolver according to claim 5 wherein each said diode means includes a Schottky contact, and further comprising an insulating layer provided on said epitaxial layer having apertures therein to provide access for said Schottky contact to said epitaxial layer, the thicknesses of said insulating layer, said aluminum nitride layer, and said dielectric layer being chosen to have their outer surfaces generally in a common plane, each said metal strip integrally extending to contact a different one of said Schottky contacts.

8. The surface acoustic wave convolver according to claim 5 and governed by the relationship:

$$0.5 < kH < 2.0$$

where k indicates the wave number of a surface acoustic wave, and H indicates the thickness of the aluminum nitride layer.

9. The surface acoustic wave convolver according to claim 5 wherein said epitaxial layer is an n-type silicon epitaxial layer and which satisfies the relationship:

$$N_D < 5.0 \times 10^{15} cm^{-3}$$

where $N_D$ indicates the impurity density of said n-type silicon epitaxial layer.

10. A surface acoustic wave convolver comprising:
a sapphire substrate having a major surface;
a piezoelectric layer provided on a first portion of said major surface;
two input transducers provided on said piezoelectric layer;
an array of metal strips each having a pair of elongated sides provided on said piezoelectric layer between said two input transducers;
a semi-conductor region provided on a second portion of said major surface set apart from said first portion;
an output electrode electrically connected to said semiconductor region;
diode means associated with said semi-conductor region, and electrically connecting each of said metal strips to said semiconductor region;
a dielectric layer provided on a third portion of said major surface between said piezoelectric layer and said semi-conductor region; and
a grounded electrode provided on said piezoelectric layer and connected to ground, said grounded electrode being in the form of comb teeth disposed along opposite sides of each of said metal strips.

11. The surface acoustic wave convolver according to claim 10 wherein each said diode means includes a Schottky contact formed from an end portion of a different one of said metal strips disposed in contact with said semiconductor reigon over equal contacting areas, and said convolver satisfies the relationship:

$$0.0015 < A_d/A_s < 0.085$$

where $A_s$ indicates the area of the opposite end portion of each said metal strip overlapping with adjacent teeth of said comb-shaped grounded electrode, and $A_d$ indicates said contacting area.

12. The surface acoustic wave convolver according to claim 1 and 10 wherein said dielectric layer is made from an insulating polymeric material.

13. The surface acoustic wave convolver according to claims 1 or 10 wherein each said diode means includes a Schottky contact in contact with said semiconductor region formed by a metal having a barrier height of no more than 1 electron volt with respect to said semiconductor region.

14. The surface acoustic wave convolver according to claim 13 wherein said input transducers comprise interdigitated finger electrodes having a first given overlap length, said teeth of said grounded electrode and said metal strips have a second given overlap length, and the overlap length of said finger electrodes of said transducers and the overlap length of said metal strips and said comb-shape grounded electrode teeth are no more than about 70 surface acoustic wave wavelengths.

* * * * *